US005198603A

United States Patent [19]

Nishikawa et al.

[11] Patent Number: 5,198,603

[45] Date of Patent: Mar. 30, 1993

[54] AUTOMATIC DATA-PREREADING PLAYING APPARATUS AND SOUND GENERATING UNIT IN AN AUTOMATIC MUSICAL PLAYING SYSTEM

[75] Inventors: Masashi Nishikawa; Satoshi Otsuka; Mitsuhiro Umeta, all of Hamamatsu, Japan

[73] Assignee: Roland Corporation, Japan

[21] Appl. No.: 769,831

[22] Filed: Oct. 2, 1991

Related U.S. Application Data

[63] Continuation of Ser. No. 425,038, Oct. 23, 1989.

[30] Foreign Application Priority Data

Aug. 19, 1989 [JP] Japan ................................ 1-213898

[51] Int. Cl.[5] ....................... G10H 7/00; G11C 00/00; H03M 00/00

[52] U.S. Cl. ........................................ 84/601; 84/609

[58] Field of Search .................. 84/601, 602, 609-614, 84/634, 635, 645, 666-669, 649-652, DIG. 12

[56] References Cited

U.S. PATENT DOCUMENTS

| | | | |
|---|---|---|---|
| 4,704,933 | 11/1987 | Kurakake | 84/DIG. 12 X |
| 4,898,059 | 2/1990 | Iizaka | 84/601 |
| 4,960,030 | 10/1990 | Fujimori | 84/609 |
| 4,969,384 | 11/1990 | Kawasaki et al. | 84/612 |
| 4,993,306 | 2/1991 | Ueta et al. | 84/601 |

*Primary Examiner*—William M. Shoop, Jr.
*Assistant Examiner*—Jeffrey W. Donels
*Attorney, Agent, or Firm*—Beveridge, DeGrandi, Weilacher

[57] ABSTRACT

An automatic musical playing playing system including an automatic playing apparatus and a sound generating unit incorporated in combination therewith, the apparatus comprising: a first memory for storing musical playing data arranged to be sequentially preread; a calculator for calculating an actual length of time required to play music based on the preread musical data and/or for calculating an actual quantity of playing information in said data; a comparator for deciding whether or not the actual length of time is less than a predetermined length, and/or whether or not the actual quantity is less than a predetermined quantity; a first reading device for sequentially prereading from the first memory the musical data prior to an actual timing for playing, in a case where the above decisions are affirmative; and an output for outputting the preread musical data wherein the above unit comprises: an input for receiving the preread musical data; a second memory for temporarily storing said data from the input; a second reading device for sequentially reading from the second memory means said data at a predetermined timing; and a musical tone-generator which generates and/or mutes musical tones for playing music according to said preread musical data.

15 Claims, 10 Drawing Sheets

FIG. 4

| NNUM | VEL | STET | GATT |
|---|---|---|---|
| — | — | — | — |
| — | — | — | — |
| — | — | | |

FIG. 11

| NNUM | NF | GATT |
|---|---|---|
| 0 | — | — |
| 1 | — | — |
| 2 | — | — |
| 126 | — | — |
| 127 | — | — |

AUTOMATIC DATA-PREREADING PLAYING APPARATUS AND SOUND GENERATING UNIT IN AN AUTOMATIC MUSICAL PLAYING SYSTEM

This application is a continuation of application Ser. No. 07/425,038, filed Oct. 23, 1989.

BACKGROUND OF THE INVENTION

1. Field of the Invention

The invention relates to an automatic musical playing system, and in particular to an automatic musical playing system which comprises an automatic playing apparatus and a sound generating unit wherein musical playing data output from the automatic playing apparatus are delivered to the sound generating unit so that desired musical tones are generated in said unit.

2. Description of Related Art

The known automatic musical playing systems of the type mentioned above are constructed such that musical playing data are stored in an automatic musical playing apparatus and are read therefrom at a timing of playing music, namely at a timing of generation and damping of musical tones. Such musical playing data are then delivered as note-on and note-off data to a sound generating unit through a communicating means such as MIDI. The sound generating unit plays music directly on the basis of said musical playing data which it has received.

SUMMARY OF THE INVENTION

It is however inevitable that in the known systems the musical playing data read from the musical playing apparatus take a considerably long time for transmission thereof to the sound generating unit. Therefore, actual timing of music playing is likely to be often delayed compared with ideal timing. This problem is serious in a case where a large amount of musical playing data are transmitted at once because the length of time for transmission of said data increases with increasing quantity of information. Thus, said delay in the timing varies in its degree in accordance with the quantity of information whereby rhythm of played music gets out of order.

The present invention was made to resolve the above-mentioned problem, and an object of the invention is to provide an automatic playing apparatus and a sound generating unit which are included in an automatic musical playing system in such a state that a music can be played always at correct timing and rhythm without being affected by any variance of the quantity of transmitted information.

According to the invention, the automatic playing apparatus in the automatic musical playing system as shown in FIG. 1 characteristically comprises:

(a) a first memory means 1 for storing musical playing data arranged in a time series;

(b) calculating means 2 for calculating an actual length of time required to play music based on the musical playing data which have been preread from the first memory means 1 and/or for calculating an actual quantity of playing information included in said preread musical playing data;

(c) comparing means 3 for deciding whether or not the actual length of time required to play music is less than a predetermined length of time, the actual length of time being calculated by said calculating means 2, and/or whether or not the actual quantity of playing information is less than a predetermined quantity of information, the actual quantity also being calculated by said calculating means 2;

(d) a first reading means 4 for sequentially prereading from the first memory means 1 the musical playing data written therein in a time series prior to an actual timing for playing, in a case where the comparing means 3 decides that the actual length of time required to play music is less than the predetermined length of time and/or that the actual quantity of playing information is less than the predetermined quantity of information; and (e) output means 5 adapted to output at least the musical playing data preread by the first reading means 4.

The sound generating unit which is incorporated in the automatic musical playing system has also characteristics as shown in FIG. 1 and comprises:

(a) input means 10 for receiving at least musical playing data which are arranged in a time series and have been preread;

(b) a second memory means 11 for temporarily storing the preread musical playing data delivered from the input means 10;

(c) a second reading means 12 for sequentially reading from the second memory means 11 the preread musical playing data written therein in a time series, in accordance with a predetermined timing; and (d) musical tone-generating means 13 for generating and/or muting musical tones for playing music according to the musical playing data read by the second reading means 12.

The musical playing data which are arranged in a time series and preread from the first memory means 1 are used by the calculating means 2 to calculate the actual length of time required to play music and/or to calculate the actual quantity of playing information included in the preread musical playing data. If the comparing means 3 decides based on the result of calculation conducted by the calculating means 2 that the actual length of time required is less than the predetermined length of time and/or the actual quantity of playing information is less than the predetermined quantity of information, then the first reading means 4 sequentially prereads from the first memory means 1 the musical playing data written therein in a time series, prior to the actual timing for playing based on said musical playing data. The thus preread musical playing data are output from the output means 5.

The preread musical playing data which are in a time series and have been delivered from the input means 10 and stored in the second memory means 11 are read therefrom by the second reading means 12 at a predetermined timing. The musical playing data thus read by said second reading means are used by the musical tone-generating means 13 in order to generate and/or mute the musical tones for the purpose of playing music.

In this way, the automatic playing apparatus feeds the musical playing data to the sound generating unit, prior to the timing of playing, the data being temporarily stored in the unit. The actual timing of playing is given by the reading of the temporarily stored musical playing data at the predetermined timing. Accordingly, the playing of music is performed always at an exact and precise timing whereby the rhythm is prevented from getting out of order during the playing, regardless the variable quantity of information transmitted from the automatic playing apparatus to the sound generating unit.

Further, as described above, the automatic playing apparatus supplies the preread musical playing data to the sound generating unit only in a case where the actual length of time required to play music is less than the predetermined length of time and/or where the actual quantity of playing information possessed by the preread musical playing data is less than the predetermined quantity of playing information. Thus, a capacity of the memory for temporarily storing the transmitted data within the sound generating unit can be minimized.

In addition, it becomes possible for the sound generating unit to generate sounds which are more effective in the musical sense, because said unit receives and temporarily store such musical playing data before instants for playing whereby said data can be interpreted in an appropriate manner.

BRIEF DESCRIPTION OF THE DRAWINGS

The present invention will become more apparent from the detailed description and the accompanying drawings, wherein:

FIGS. 2 to 13 illustrate embodiments of an automatic playing apparatus and a sound generating unit which are included in an automatic musical playing system according to the invention; in which;

FIG. 2 shows in outline the system;

FIGS. 3 and 10 are flowcharts showing respective main routine programs in the automatic playing apparatus and the sound generating unit;

FIGS. 4 and 11 show structures of musical playing data and a note map which are respectively written into RAMs of the automatic playing apparatus and the sound generating unit;

FIGS. 5, 6, 7 and 12 are flowcharts of a panel processing routine, a playing address-processing routine, a musical playing data-reading routine and a sound generating/muting routine, respectively; and FIGS. 8, 9 and 13 also are flowcharts of an MIDI OUT-interrupt processing, a timer interrupt processing and an MIDI IN-interrupt processing, respectively.

DETAILED DESCRIPTION OF THE PREFERRED EMBODIMENTS

Figure 1:
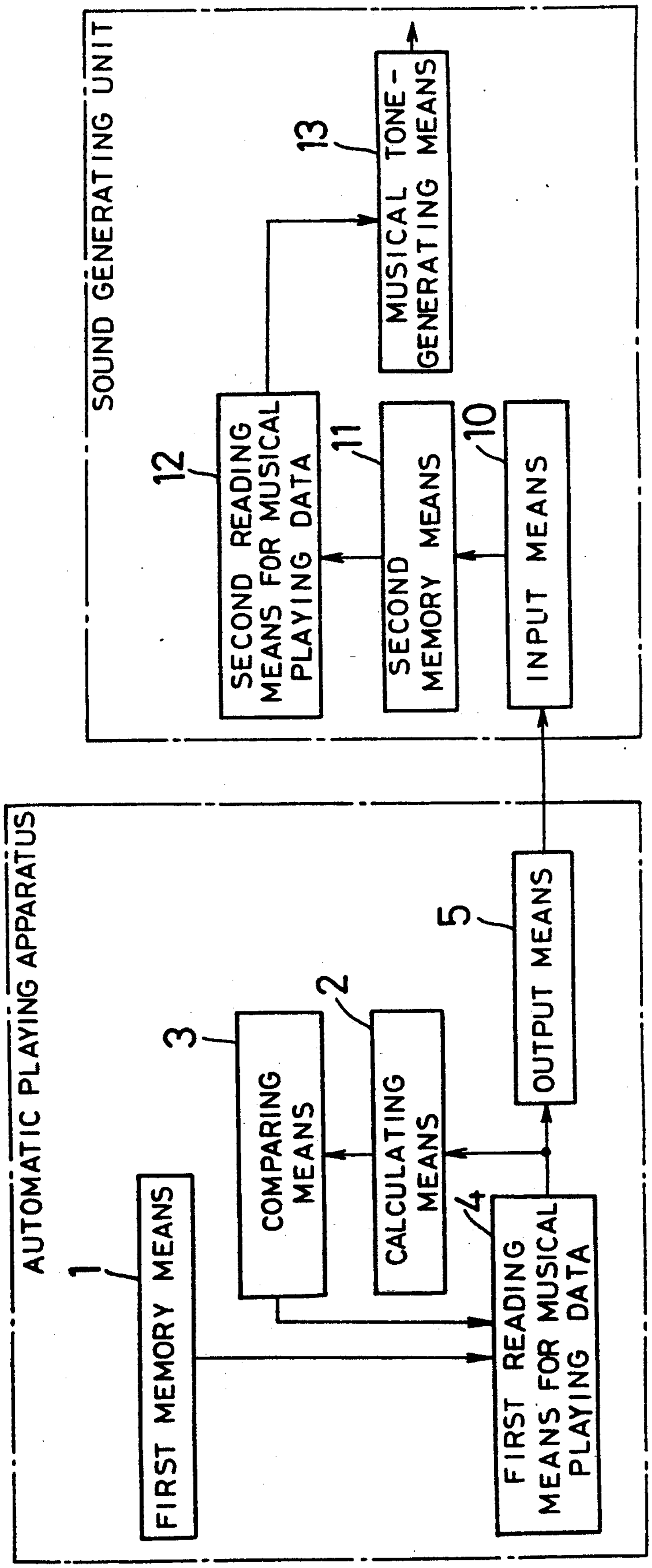
FIG. 1 is a block diagram showing the invention as defined in the claims.

Preferred embodiments of an automatic playing apparatus and a sound generating unit which are incorporated in an automatic musical playing system in accordance with the invention will now be described referring to the drawings.

Figure 2:
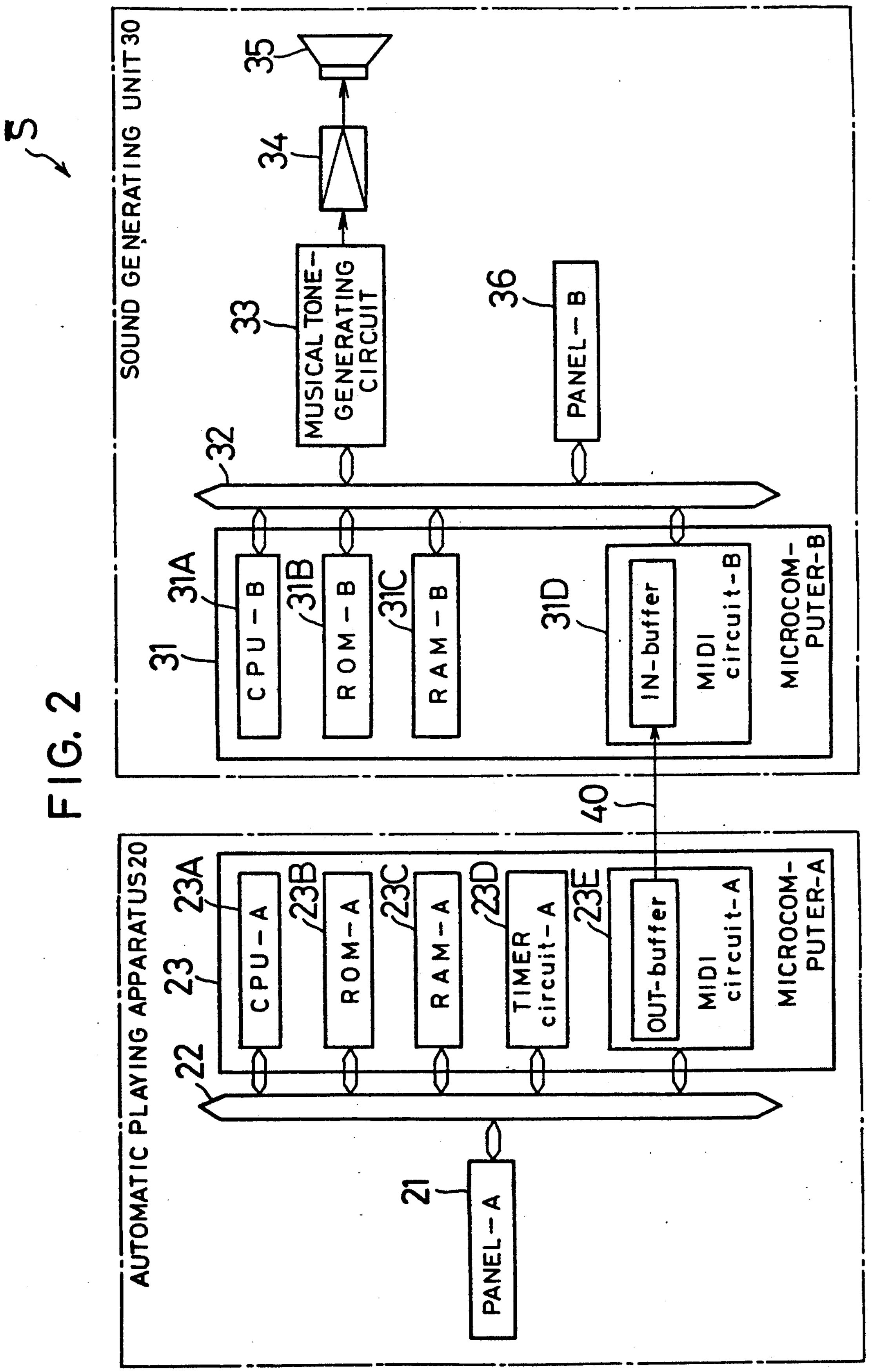

As shown schematically in FIG. 2, the automatic musical playing systems comprises the automatic playing apparatus 20 and the sound generating unit 30. The automatic playing apparatus 20 stores therein musical playing data in a time series which are preread and output therefrom as such MIDI (Musical Instrument Digital Interface) data that are defined as exclusive messages in the MIDI standard. These preread musical playing data which are output as the exclusive messages of MIDI data are then input into the sound generating unit 30 through an MIDI bus 40. The sound generating unit 30 generates or mutes desired musical tones on the basis of such inputs of the preread musical playing data for the purpose of playing music. In addition to such exclusive messages, the MIDI data includes some real-time messages such as start-data, stop-data and timing-clock data which also are input into the unit 30 via the MIDI bus 40.

A panel-A 21 is included in the automatic playing apparatus and is provided with a start-switch, a stop-switch and other members. The panel-A 21 gives through a bus-A 22 to a microcomputer-A 23 such commands that cause the automatic playing of music to start or stop. The microcomputer-A 23 comprises: a central processing unit (CPU)-A "23A" adapted to execute predetermined programs; a read-only memory (ROM)-A "23B" in which the programs are written; a random-access memory (RAM)-A "23C" which is provided with a musical playing data area for the writing of the musical playing data in a time series and with a working area including such registers, flags and FIFOs that are needed for execution of the programs; a timer circuit-A "23D" which measures the time lapse during the execution of programs so as to cause timer interrupts in the CPU-A "23A" at predetermined regular intervals; and an MIDI circuit-A "23E" which outputs onto the MIDI bus 40 the musical playing data which are preread from the musical playing data area within the RAM-A "23C" and other data as the MIDI data. The MIDI circuit-A "23E" has an OUT-buffer which is of a data length of 1 (one) byte and used to output the MIDI data. Thus, the microcomputer-A 23 executes the predetermined programs which have been written in the ROM-A "23B" and then receives from the panel-A 21 the commands for start and stop of the automatic musical playing. In more detail, the musical playing data are preread, as described hereinabove, from the musical playing data area of the RAM-A "23C" so that they are then output through the MIDI circuit-A "23E" as the MIDI data, in particular as the exclusive messages thereof.

On the other hand, a microcomputer-B 31 in the sound generating unit receives through the MIDI bus 40 the MIDI data comprising the exclusive messages of the preread musical playing data and the real-time messages. In detail, the microcomputer-B 31 comprises: a central processing unit(CPU)-B "31A" which executes the predetermined programs a read-only memory(-ROM) "31B" in which the programs are written; a random-access memory(RAM)-B "31C" having a working area comprising such registers, FIFOs and maps that are necessary for execution of the programs; and an MIDI circuit-B "31D". The abovementioned MIDI data are given to an IN-buffer which is of a data length of 1 (one) byte and installed in the MIDI circuit-B "31D". The microcomputer-B 31 executes the predetermined programs which have been written in the ROM-B "31B" whereby the MIDI data are utilized which include the exclusive messages of such preread musical playing data and the real-time messages that are input onto the IN-buffer of the MIDI circuit-B "31D" via the MIDI bus 40. A musical tone-generating circuit 33 is controlled through a bus-B 32 by the microcomputer 31 which is executing the predetermined programs whereby musical tones are generated or muted for the playing of desired music through an amplifier 34 and a loudspeaker 35. The numeral 36 denotes a panel-B comprising an operating part for input of necessary commands and an indicating part for indication of the kinds of operations.

AUTOMATIC PLAYING APPARATUS

Figure 3:
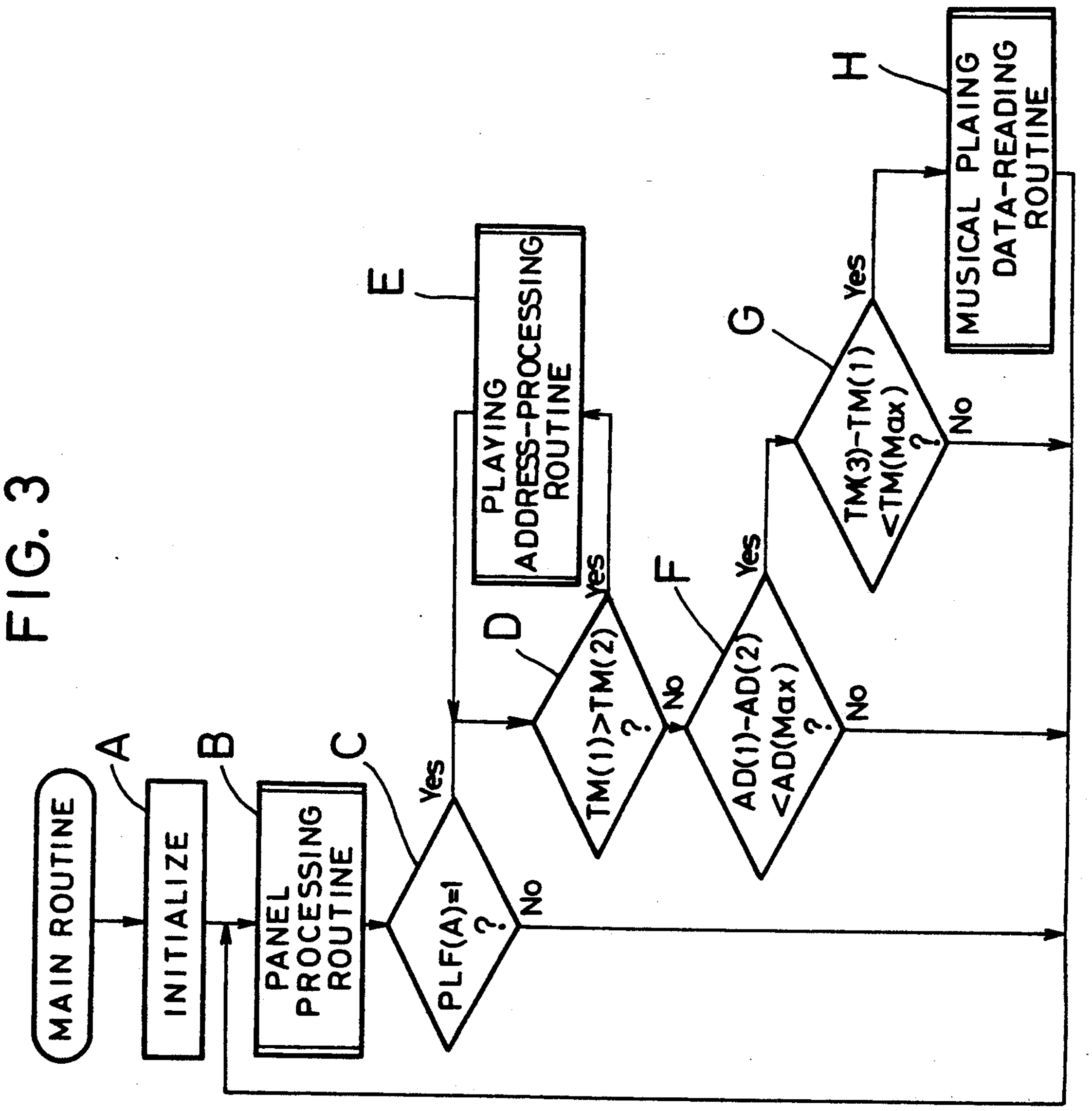

Basic functions of the automatic playing apparatus 20 constructed as above will now be explained referring to the flowchart showing the main routine given in FIG. 3.

At first, the registers, flags and FIFOs within the working area and the musical playing data area which are formed in the RAM-A "23C" will be described.

Figures 4, 11:
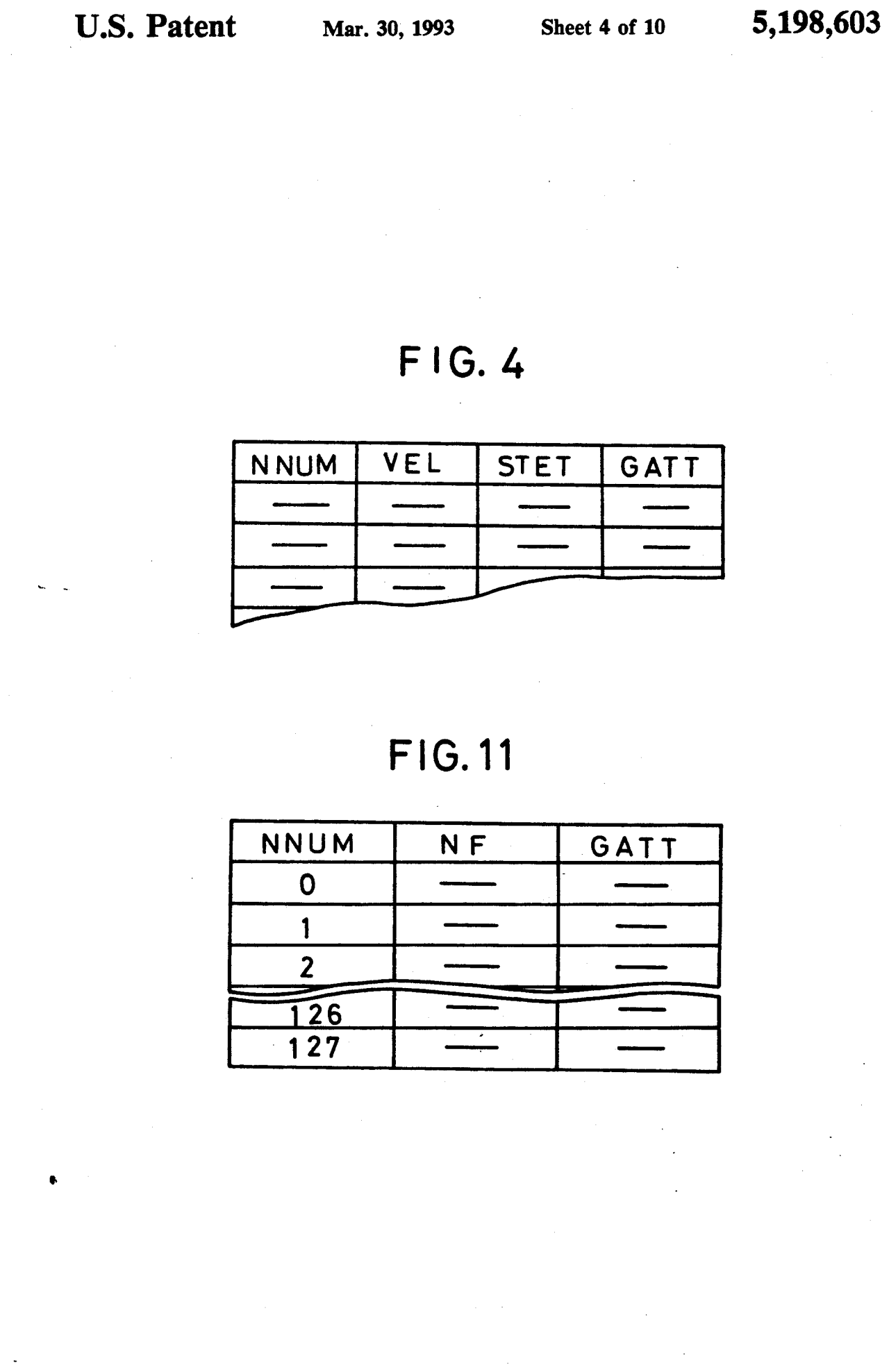

(1) Musical Playing Data Area (FIG. 4)

The musical playing data area in this embodiment stores a series of musical playing data on its one track. Each of the musical playing data comprises a note number NNUM, a velocity VEL, a step time STET and a gate time GATT, these components being explained hereinafter. A number of such musical playing data correspond to the number of musical notes, and these data are sequentially written on the track in time series. Further, there are areas for said note number NNUM, velocity VEL, step time STET and gate time GATT for each musical note. Each musical playing data which corresponds to one musical note is written at one address. In general, there is provided in the musical playing data area a plurality of tracks which can simultaneously be read out therefrom.

The abovementioned data and other components or data of the musical playing data area are defined as below:

(i) The note number NNUM represents, for instance, pitches of keys which are depressed;

(ii) The velocity VEL represents, for instance, speeds of key-depression based on initial touch of keys;

(iii) The step time STET represents time lapse (differential length of time) from the previous note-on of one musical note to the current note-on of the other immediately succeeding musical note;

Such step time STET determines the timing of generation of musical tones;

(iv) The gate time GATT represents duration of musical note (time lapse from note-on to note-off); and The step time STET and the gate time GATT respectively have their values proportional to length of time wherein the value "24" (twenty four) corresponds to the time length of a quarter note (or crotchet), the value "12" (twelve) corresponding to the time length of an eighth note (or quaver).

(2) Working Area (i) Time count TM(1)—This represents time lapse and has a value which increases by one at regular intervals, caused by the timer interrupt;

(ii) Time count TM(2)—This increases by one for each playing address processing so as to represent progression in time of the music playing which is played by the sound generating unit 30 based on the preread musical playing data;

(iii) Time count TM(3)—This represents progression in time of the prereading of the musical playing data from the playing data area wherein the step time STET of the preread musical playing data is totaled every time when musical playing data-reading is carried out;

(iv) Address value AD(1)—This indicates an address in the musical playing data area from where the musical playing data is preread:

(v) Address value AD(2)—This indicates an address of such a preread musical playing data that is to be played next by the sound generating unit 30;

(vi) Step value STE(A)—This has a value corresponding to the value of the step time STET of the musical playing data, but decreases its value by one every time when playing address-processing is carried out, whereby this Step value STE(A) is utilized to determine an address of such preread musical playing data that is to be played next by the sound generating unit 30;

(vii) Play flag PLF(A)—This indicates that music is being played;

(viii) Real-time flag RTF—This indicates a state in which the real-time messages of start data, stop data and timing clock data which are defined in the aforementioned MIDI standard are preferentially output;

(ix) Out-FIFO—This is a first-in first-out (FIFO) memory used to output the such MIDI data that are not the real-time messages;

(x) Real-time FIFO—This is another first-in first-out (FIFO) memory used to output such MIDI data that are the real-time messages.

The Out-FIFO and the Real-time FIFO are formed to have a ring-like shape such that a write pointer and a read pointer can respectively appoint addresses where writing and reading are to be done, and values of said pointers increases every time when writing or reading is done.

(I) Outline of the Main Routine

The programs for the automatic playing apparatus in the embodiment are executed as follows:

Step A—If a power source is turned on, then the RAM -A "23C" and MIDI circuit-A "23E" are initialized so that content thereof can be allotted to various registers or the like in order to start the programs.

Step B—Panel processing routine—Here conducted is the panel processing of the start switch, the stop switch and other members on the panel-A 21. Details will be given below referring to the flowchart shown in FIG. 5.

Step C—Decision is made as to whether the play flag PLF(A) is or is not "1". If the play flag PLF(A) is not "1" but "0" showing that music is not being played, then the process returns to Step B.

Step D—If the play flag PLF(A) is judged to be "1" in the decision at Step C, indicating that music is being played, then further decision is made on whether the value of the time count TM(1) which represents time lapse is is not higher than the value of the other time count TM(2) which represents the progression in time of such music playing that is played by the sound generating unit 30 based on the preread musical playing data. If the time count TM(1) is not higher than the time count TM(2) thereby indicating that the playing address-processing is going fast, then the process goes to Step F. On the contrary, if the time count TM(1) is higher than the time count TM-2 indicating delay of said processing, then the process advances to the following step.

Step E—Playing address-processing routine—An address is appointed which corresponds to such a preread musical playing data that is to be played by the sound generating unit 30. Details will be given later referring to the flowchart shown in FIG. 6.

Step F—In the case where the time count TM(1) is not higher than the other time count TM(2) thereby indicating that the playing address-processing is going fast, the difference is checked which exists at that time between the address value AD(1) and the other address value AD(2), the former indicating the address in the musical playing data area from where the musical playing data is preread, and the latter indicating the next address of such preread musical playing data that is to be played next by the sound generating unit 30. In other words, here is discussed such a quantity of addresses that will be found between an address which is located ahead of the present address and a present address which corresponds to such musical playing data that has been preread from the playing data area for which playing is being conducted. If such a quantity of addresses is decided to be not less than a predetermined value AD(Max) which gives a maximum quantity of information of preread musical playing data, then the process returns to Step B.

Step G—If in the decision at Step F the difference between the address values AD(1) and AD(2) is less than the predetermined value AD(Max), then a difference between the time count TM(3) representing progression or leading in time of the prereading of the musical playing data and the time count TM(1) representing time lapse is checked. In other words, a decision is made on whether a length of leading time representing a degree to which the prereading from the musical playing data area is going ahead beyond the actual playing music is or is not less than a predetermined value TM(Max) which gives such a maximum length of leading time that is permitted in this program for the musical playing data to be preread. If the length of leading time is not less than said value TM(Max), then the process returns to Step B. If, on the contrary, said length of leading time is less than said value TM(Max), then process goes to the following step.

Step H—Musical playing data-reading routine—Details will be given hereinafter referring to the flowchart shown in FIG. 7.

The main routine program described above is so constructed that, in summary, the progression degree of the preread musical playing data compared with actual advance of the playing of sounds is expressed by means of the preread quantity of information [AD(1) - AD(2)] and also by means of the length of leading or progressing time of the prereading [TM(3) - TM(1)]. The reading of musical playing data is carried out only in a case where both of these two differences are respectively less than the predetermined values AD(Max) and TM(Max). Such conditions in respect of the preread quantity of information [AD(1) - AD(2)] and the length of leading time [TM(3) - TM(1)] are incorporated herein for the purpose of preventing the prereading from advancing more fast than required. In more detail, the condition on the preread quantity [AD(1) - AD(2)] inhibits an excessive quantity of musical playing data more than the predetermined value AD(Max) from being transmitted to the sound generating unit 30. Thus, a temporary storage FIFO(1) within the sound generating unit 30 is protected from overflow.

The condition on the leading time [TM(3) -TM(1)] prevents said unit 30 from receiving any unnecessarily early preread data. Consequently, an operator of this system who is modifying the musical data during his operation need not be afraid that such musical playing data on which he may want to make changes or addition have been output already. Furthermore, the above-mentioned conditions as to the preread quantity [AD(1) - AD(2)] and the leading time [TM(3) - TM(1)] provide, in view of the fact that the reading of musical playing data is executed stepwise "one data by one data", another advantage. Such a restricted manner of prereading as in the embodiment is effective to average an information rate or density per unit time of the musical playing data which are input into the sound generating unit 30. This makes it possible to minimize undesirable influences upon other processings other than the data input processing in said unit 30.

The predetermined value AD(Max), which as described above is the maximum quantity of musical playing preread from the musical playing data area, is made less than a memory capacity of the temporary storage FIFO(1) of the sound generating unit 30. Said value AD(Max) is 100 in quantity of addresses in the embodiment. The memory capacity of said storage FIFO(1) is 120 also in quantity of addresses so that there is provided an excess of capacity which allows a certain degree of delay in the processings conducted in the unit 30.

Although the predetermined value AD(Max) is fixed at that value in this embodiment, it may be made variable so as to be adapted for a variety of the memory capacities of temporary storage as well as for a variety of the processing speeds in alternative sound generating units employed herein. Informations or data such as the memory capacity of temporary storage FIFO(1) and the processing speed in said unit 30 may be indicated on for instance the panel-B 36 thereof or given to the automatic playing apparatus 20. In order to change the variable value AD(Max) in the modification suggested above, it is possible not only to set said value by means of manual members but also to automatically set it based upon the memory capacity data given by said unit 30 to the automatic playing apparatus 20.

The predetermined value TM(Max), which as described above represents such maximum length of time that the prereading of musical playing data from the playing data area can be allowed to precede the actual playing of sounds, is set to be equal to a length of time corresponding to 16 (sixteen) quarter notes, thus corresponding to 4 (four) measures for a rhythm of four-four musical time. However, said predetermined value TM(Max) may be changed for the convenience of music playing, for example according to tempo of music playing.

(II) Details of the Subroutines

Before descriptions of the subroutines referred to above and including the panel processing routine (Step B), the playing address-processing routine (Step E) and the musical playing data-reading routine (Step H), the following interrupt-processing routines are explained at first. The latter routines include an MIDI-out interrupt-processing and a timer interrupt-processing routines, one of them being masked while the other is being executed.

Figure 8:
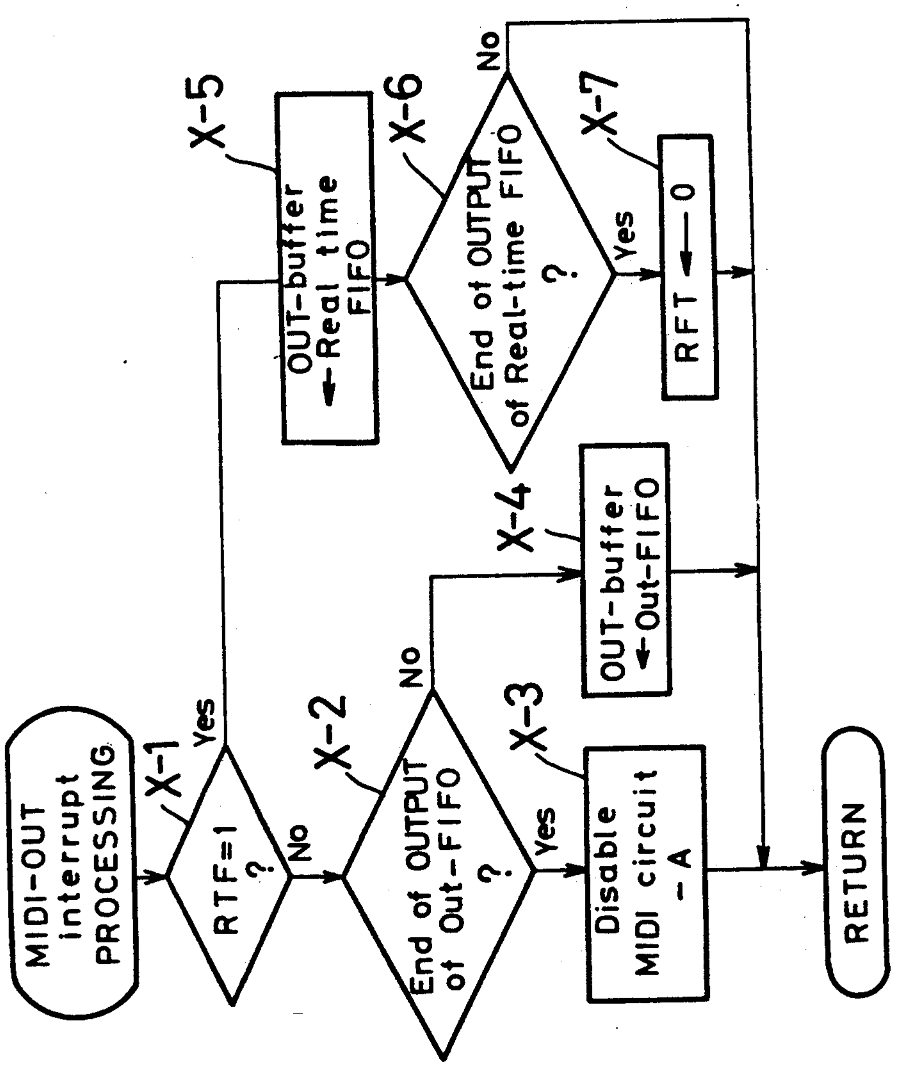

(a) MIDI-out interrupt-processing routine (FIG. 8)

The MIDI-out interrupt is turned on when the MIDI circuit-A "23E" is at its "enable" state and the MIDI data stored in the OUT-buffer have been output so that the state has become ready for output of the next MIDI data. This MIDI-out interrupt shall be canceled after either the MIDI data have been written in the OUT-buffer or the MIDI circuit-A "23E" has been turned into its disable state. In order to output the MIDI data which are to be output, it is necessary to write such MIDI data either into the Out-FIFO or into the real-time FIFO thus making enable the MIDI circuit-A "23E", through processings other than the MIDI-out interrupt processing.

With the abovedescribed MIDI-out interrupt turned on, the following processings are executed.

Steps X-1 to X-4

At first, a decision is made on whether the real-time flag RTF is or is not "1". "1" indicates that MIDI data of real-time messages which are of a higher preference and includes start-data, stop-data and timing clock data must be output. If the real-time flag is not "1" but "0", then a further decision is made as to whether or not all the data stored in the Out-FIFO have been output already. This latter decision is carried out based on whether the writing pointer and the reading pointer of the Out-FIFO do or do not co-incide with each other. If yes, it is decided that the output of said MIDI data from the Out-FIFO has finished, and consequently the MIDI circuit-A "23E" is turned into its disable state. If no, i.e. if there are some data remaining in said Out-FIFO, then one byte of said remaining data is transmitted to the OUT-buffer.

Steps X-5 to X-7

If the real-time flag RTF is judged to be "1" in the decision mentioned above, then one byte of such MIDI data that are stored in the real-time FIFO is sent to and written into the OUT-buffer. Further in such a case, an additional decision is made as to whether the writing pointer and the reading pointer of the real-time FIFO do or do not coincide with each other. In other words, it is decided on whether or not all of the MIDI data stored in the real-time FIFO have been output. If yes, "0" is set at the real-time flag RTF, but if no, this routine is ended..

The abovedescribed MIDI-out interrupt processing routine is such that in the "ON" state of MIDI interrupt the MIDI data of the real-time messages which are of higher preference and stored in the real-time FIFO are preferentially transferred to the OUT-buffer so as to be output.

Figure 9:
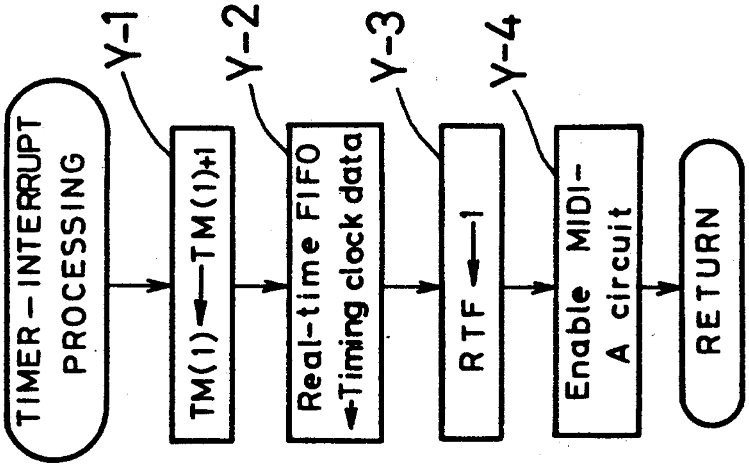

(b) Timer interrupt-processing routine (FIG. 9)

The timer interrupt is turned on at intervals corresponding to one twenty-fourth of the time length which one quarter note has. Said interval is for instance about 21 msec in such a tempo that comprises 120 (one hundred and twenty) quarter notes per minute. This interval of time determines the tempo and the timings at which every generation and muting of sounds.

With the timer interrupt turned on, the following processings are conducted as described below.

Steps Y-1 to Y-4

At first, the content of the time count TM(1) is increased by adding "1" thereto, and subsequently the timing clock data as one of the real-time messages is written into the real-time FIFO. Then the real-time flag RTF used for preferential output of the real-time messages is set at "1", followed by the next step for making enable the MIDI circuit-A "23E".

Thus, this timer interrupt-processing routine cooperates with the MIDI-out interrupt-processing routine in order that the timing clock data are preferentially written into and output from the OUT-buffer. Such timing clock data play an important role as a standard clock in causing the sound generating unit 30 to synchronously play a desired music based on the given musical playing data.

(c) Panel processing routine (Step B)

Figure 5:
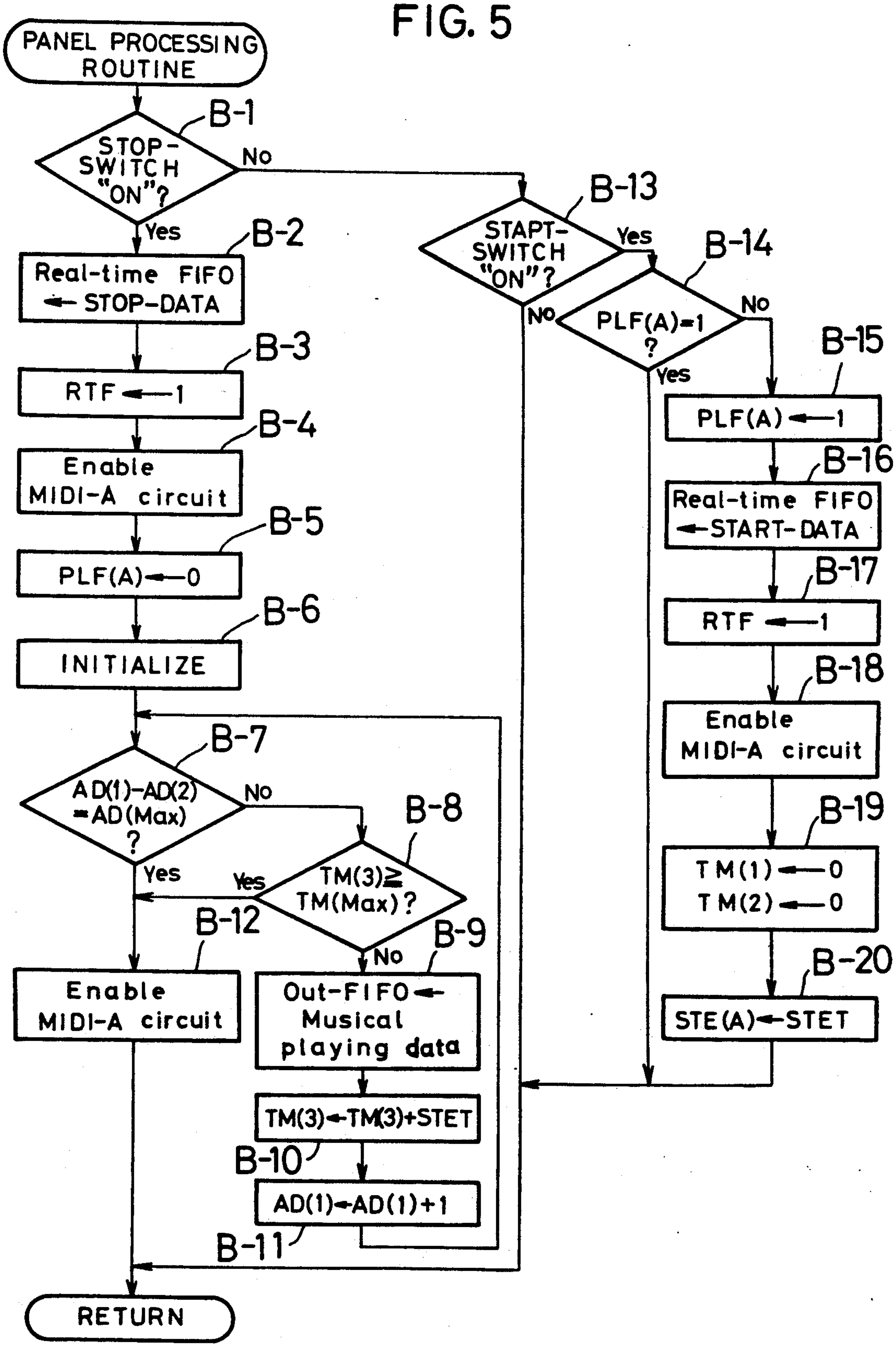

The details of the aforementioned panel processing routine will now be explained with reference to FIG. 5.

Steps B-1 to B-4

If a stop-switch at the panel-A 21 is switched from its "OFF" state to its "ON" state then the stop-data as one of the real-time messages is written in the real-time FIFO. Subsequently, "1" is set to the real-time flag RTF utilized to preferentially output such real-time messages. Further, the MIDI circuit-A "23E" is made enable for output of the stop-data as a command for stopping the playing. The sound generating unit 30 stops playing of music when it has received this stop-data.

Steps B-5 and B-6

The value of the play flag PLF(A) is changed to "0" indicating a state that music is not being played. Then executed are necessary initializations including: Setting "0" to the time count TM(3) representing progression in time of the prereading of musical playing data from the musical playing data area; Assigning of the leading address of musical playing data area to the address value AD(1) indicating an address in said data area from where the musical playing data is read; Assigning also of the leading address of musical playing data area to the address value AD(2) indicating address of such preread musical playing data that is to be played next by the sound generating unit 30; and Setting "0" to the step value STE(A).

Steps B-7 to B-12

The musical playing data are written in sequence into the Out-FIFO until there are stored therein a pre-determined number of these data (this number corresponding to the predetermined value AD(Max) which gives the maximum quantity of information of the musical playing data preread from the playing data area, or corresponding to the predetermined value TM(Max) which gives such a maximum length of leading time that is permitted for the musical playing data to be preread). To be concrete, the step time STET of musical playing data is accumulated as the time count TM(3) representing said progression in time of the prereading, each time when the musical playing data is read out. Increased subsequently and incrementally by 1 (one) is the address value AD(1) which indicates the preread address in musical playing data area. If the predetermined number of musical playing data have been stored into the Out-FIFO in the manner just described above, then they are output by changing the MIDI circuit-A "23E" into its enable state wherein the predetermined number of data is a number of addresses defined by the predetermined value AD(Max) or a length of time defined by the predetermined value TM(Max).

Steps B-13 to B-18

If the start-switch at the panel-A 21 is switched from its "OFF" state into its "ON" state and the play flag PLF(A) is not "1" but "0" indicating no playing of music, then at first "1" is set to said play flag PLF(A) to indicate a state in which a desired music is being played, thereafter the start-data being written as one of the real-time messages into the real-time FIFO. After "1" is subsequently set to the real-time flag RTF, the MIDI circuit-A "23E" is activated to take its enable state so as to output the start-data indicating start of music playing. The sound generating unit 30 receives this start-data and begins the playing of music based on the musical playing data which have previously been preread and input to said unit.

Steps B-19 and B-20

The time counts TM(1) and TM(2) are initialized to "0", followed by the setting of the step time STET of the leading musical playing data to the step value STE(A).

(d) Playing address-processing routine (Step E)

Figure 6:
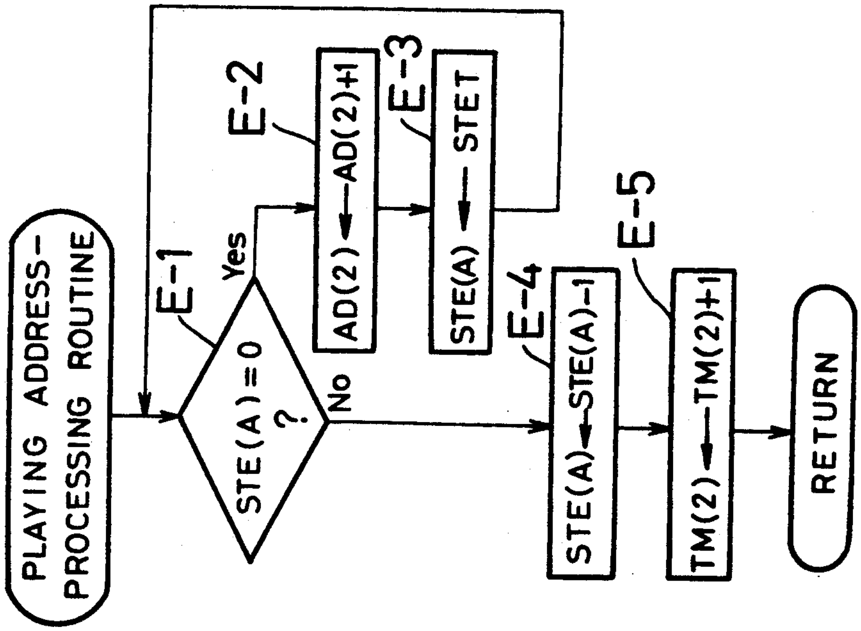

This routine is shown in FIG. 6 and functions as follows.

Steps E-1 to E-3

A decision is made on whether the step value STE(A) is "0" or not. If this value is "0", the musical playing data in question is now to be processed to play. Therefore, in order to incrementally increase the address value AD(2) by "1" (one), "1" is added to said value AD(2) which has been indicating such an address of preread musical data that is to be played next by the sound generating unit 30. Consequently, such a renewed address value AD(2) is then utilized to read from the musical playing data area the next musical playing data, whose step time STET is substituted for a then-existing content of the step value STE(A).

Steps E-4 and E-5

In a case where the step value STE(A) is not "0", "1" is subtracted from the current content thereof, the reduced value thereby indicating a time lapse. The time count TM(2) is thus increased by "1".

To summarize in short, the abovedescribed playing address-processing routine is such that a musical playing data is read at its actual timing of playing, and an address corresponding to this reading of the data is employed as an address value AD(2) effective at that time in order to determine such an address that corresponds to a musical playing data which should be played next by the sound generating unit 30.

(e) Musical playing data-reading routine

Figure 7:
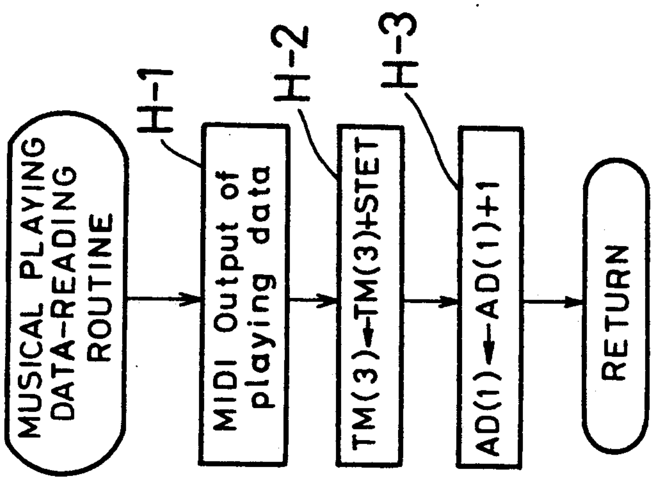

Finally, this routine as the Step H is described referring to FIG. 7.

Steps H-1 to H-3

A musical playing data which is stored in the musical playing data area at such a location that is addressed by the address value AD(1) is written into the Out-FIFO. The MIDI circuit-A "23E" is then activated to its enable state to output this musical paying data which in this case is of a nature of an exclusive message and still having time-informations such as the step time STET and the gate time GATT, these informations being those which have been possessed by said musical playing data in the musical playing data area. Next, the time count TM(3) is increased by a value corresponding to the step time STET of said musical playing data which was output in the preceding step. Further, "1" is added to the address value AD(1) to thereby cause advance by "1" of the address which is accessible next time in the musical playing data area.

SOUND GENERATING UNIT

Figure 10:
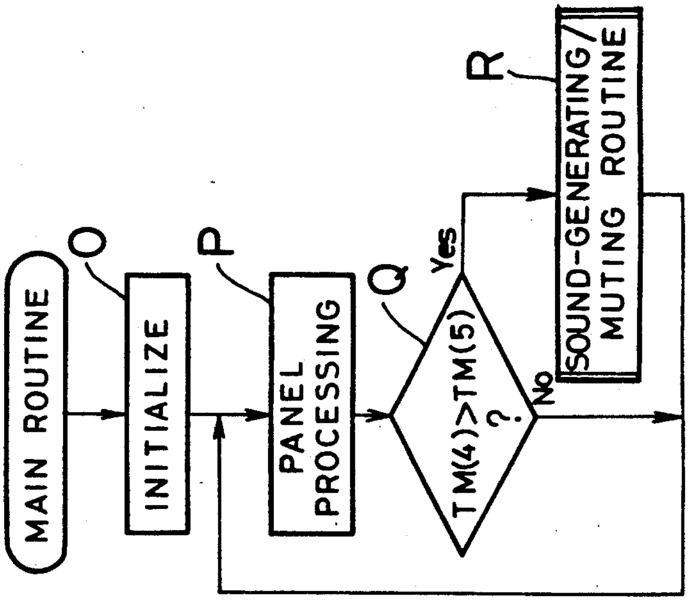

Basic functions of the sound generating unit 30 which is constructed as aforementioned will now be described in detail referring to the flowchart of main routine shown in FIG. 10. At first, a memory area provided in the RAM-B "31C" is outlined.

(1) Working area (i) Play flag PLF(B) indicates a state in which music is being played.

(ii) Time count TM(4) is increased by "1" each time when the timing-clock data is received, thereby indicating time lapse.

(iii) Time count TM(5) is increased by "1" each time when a processing according to the sound-generating/muting routine is executed to read musical playing data which have been temporarily stored, thereby indicating advance of the processing.

(iv) Step value STE(B) is used to determine a timing at which a sound is to be generated for execution of sound-generating/muting routine.

(v) In-FIFO is a first-in first-out memory used when MIDI data are input.

(vi) FIFO(1) is another first-in first-out memory used to temporarily store musical playing data as exclusive messages which have been stored in and transmitted from the In-FIFO.

These IN-FIFO and FIFO(1) are formed to be of a ring-like shape such that a writing pointer and a reading pointer indicates addresses accessible for writing and reading, respectively. Said pointers are caused to advance each time when reading or writing is executed.

(vii) FIFO buffer is used to temporarily store the musical playing data having a length corresponding to one musical note. This buffer comprises areas to store the note number NNUM, the velocity VEL, the step time STET and the gate time GATT. The musical playing data stored in the FIFO(1) are to be stored once in this FIFO buffer before supplied for various uses.

(viii) Note map shown in FIG. 11 is provided for the sound-generating/muting routine and comprises areas for note flags NF which respectively indicate ON/OFF states of the notes carrying note numbers "0" to "127". The note of each map further comprises areas for the gate time GATT for each note.

(I) Outline of Main Routine

Step O—A predetermined program starts when the power source is turned on, and the RAM-B "31C" which are assigned to registers and other areas is initialized. Further, initial setting commands are given to the MIDI circuit-B 31D and the musical tone- generating circuit 33.

Step P—Detection is carried out to identify desired operations which are set by means of manually operable members at an operating section, the thus identified operations and the other informations being indicated on an indicating board section.

Step Q—Decision is made on whether a value of the time count TM(4) has or has not exceeded a value of the time count TM(5). If "No", then the process returns to Step P whereas the process goes ahead to the next step in case of "Yes" in the decision.

Step R—Sound-generating/muting routine—Musical playing data which have been preread and are stored in the FIFO(1) are read therefrom according to a timing of sound-generation. Besides, search by means of the note map is conducted to find out musical notes which are at their timing to be muted. Based upon the above two processings, the musical tone-generating circuit 33 executes the sound-generating/muting routine. Details will be given later referring to a flowchart shown in FIG. 12.

(II) Details of Subroutines

MIDI IN interrupt-processing routine is described at first, and then description of the sound-generating/muting routine will follow.

Figure 13:
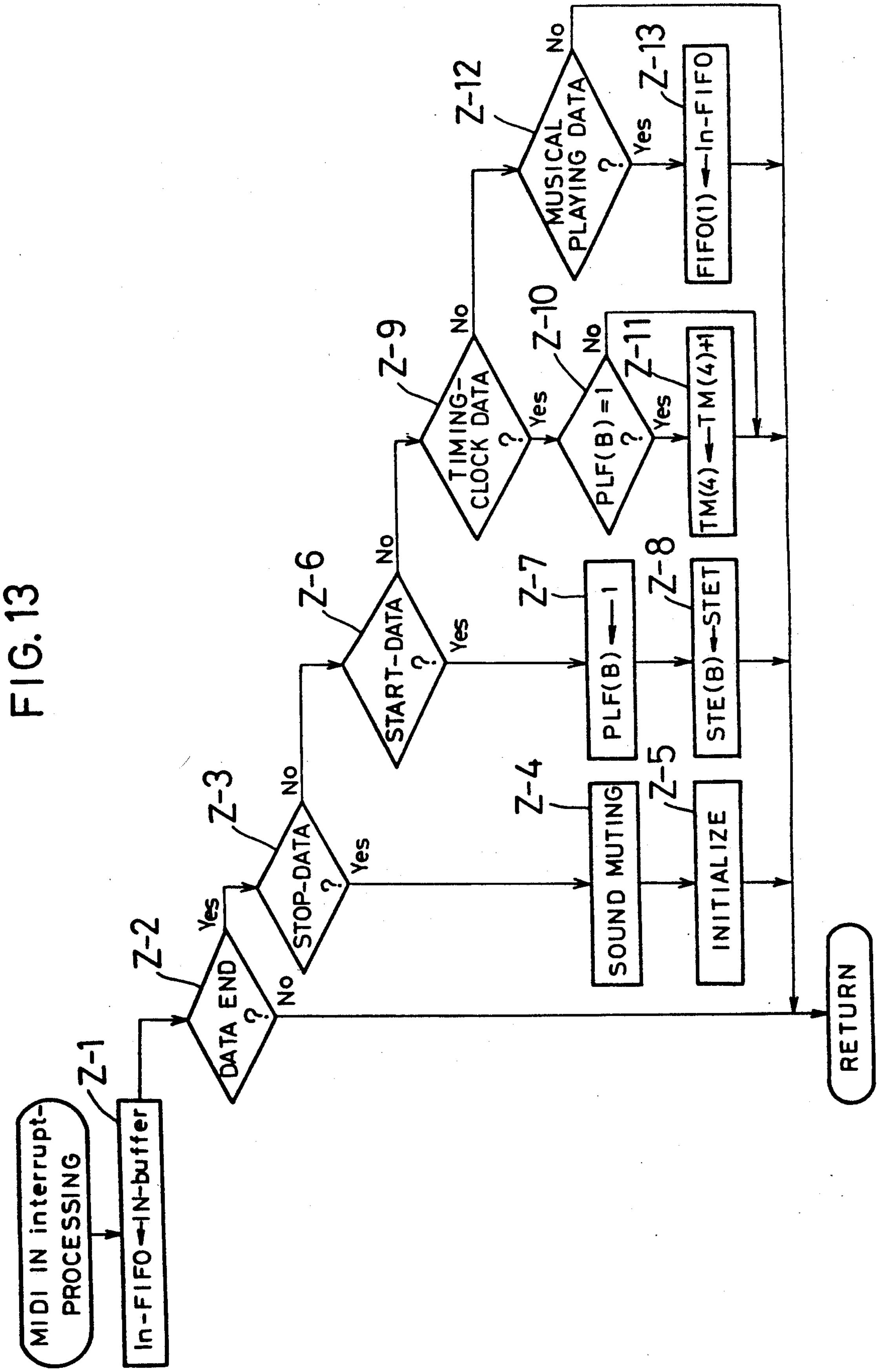

(a) MIDI IN interrupt-processing routine (FIG. 13)

MIDI IN interrupt is turned on when MIDI data are input so as to be stored in IN-buffer. Kinds of processings to be executed are decided depending upon kinds of the input MIDI data.

Steps Z-1 and Z-2

The MIDI data which are stored in the IN-buffer are transferred to In-FIFO. The following processings according to kinds of data are executed in a case where the input MIDI data is judged either to have obtained such standard length according to the kinds of data as defined in the MIDI standards, or to be of such a kind that indicates an end of exclusive messages which end in turn indicates the ending of MIDI data input.

Steps Z-3 to Z-5

If the MIDI data is decided to be a stop-data of the real-time messages, then a command is given to the musical tone-generating circuit 33 to execute sound-muting so as to mute the sound which is being generated at that instant. Subsequent to this processing, initialization of the writing and reading pointers of FIFO(1), the play flag PLF(B), the FIFO buffer, the time counts TM(4) and TM(5) is executed.

Steps Z-6 to Z-8

If the MIDI data is judged to be a start-data of the real-time messages, then "1" is set to the play flag PLF(B), and a musical playing data corresponding to the leading one musical note is read from FIFO(1) and transferred to the FIFO buffer. Thereafter, the step time STET written in the FIFO buffer is set to the step value STE(B).

Steps Z-9 to Z-11

In a case where the MIDI data is a timing-clock data as one of the real-time messages, decision is made as to whether the play flag PLF(B) is "1" or not. If "Yes" in this decision, then "1" is added to the time count TM(4) to renew the content thereof.

Steps Z-12 and Z-13

If the MIDI data is judged to be a musical playing data as one of the exclusive message, then the content of In-FIFO is transferred to the FIFO(1).

It will be understood that this routine is ended in a case where the MIDI data in question is neither any one of the stop-data, start-data and timing-clock data as the real-time messages, nor the musical playing data as exclusive massage.

(b) Tone-generating/muting routine (Step R)

Figure 12:
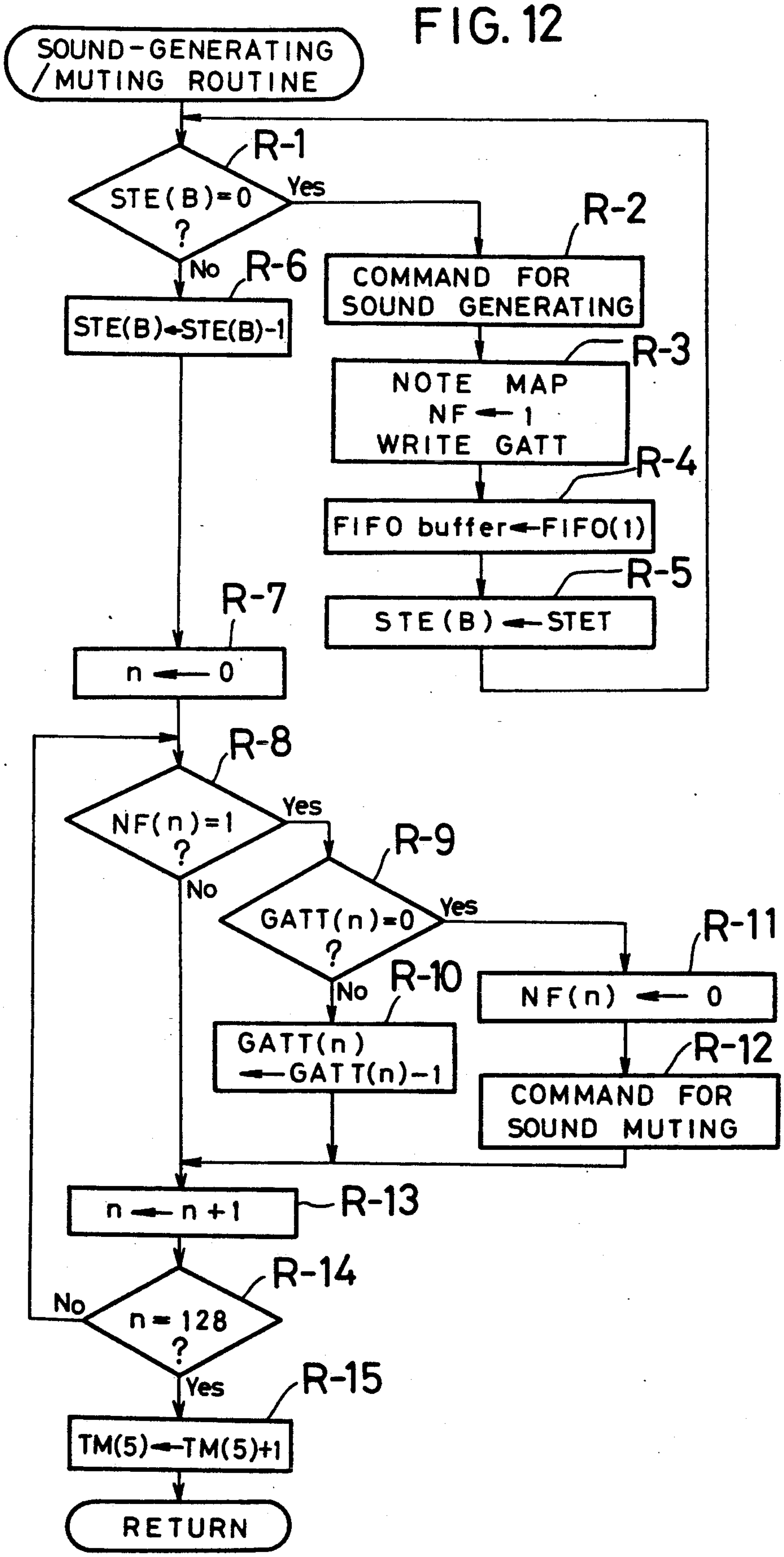

FIG. 12 is now referred to as showing this routine.

Steps R-1 to R-5

At first, decision is made on whether the step value STE(B) is or is not "0". If "Yes", then a command for generation of a musical tone is given to the musical tone-generating circuit 33, on the basis of note number NNUM and velocity VEL which are included in the musical playing data stored in the FIFO buffer. Thus, the circuit 33 generate the sound depending upon data included in the command. At the next step, "1" is set to the note flag NF which is included in the note map and corresponds to the note number NNUM relating to the command mentioned above. A further processing executed also at this step is the reading of gate time GATT from FIFO buffer so as to write same on an area corresponding to said note number NNUM in said note map. A succeeding musical playing data which corresponds to the next one note is then read from the FIFO(1) and transferred to the FIFO buffer, thereafter the step time STET stored in this buffer being set to the step value STE(B).

As will be seen, these steps are so composed that the musical note-generating circuit 33 is given a command to generate a sound when its timing has come, and at the same time preparation is made for the next musical playing data.

Step R-6

If STE(B) is not "0" at Step R-1, then "1" is subtracted from the STE(B).

Step R-7 to R-15

If the gate time GATT is not "0" for a note number NNUM whose note flag NF is "1", then "1" is subtracted from said gate time GATT. However in a case where the gate time GATT is "0" for a note number NNUM whose note flag NF is "1", "0" is set to the note flag NF for said note number NNUM and a command causing the sound to be muted is given to the musical tone-generating circuiat 33. These sequence of steps are repeated for each of note numbers NNUM "0" to "127", and finally the time value TM(5) is increased by "1" when the process has completed all of the processings in this routine.

Thus, the steps R-8 to R-15 are designed such that a command for the muting of sound is given to the sound generating circuit 33 when its timing has come.

OPERATION

Operation and functions of the above described automatic playing apparatus 20 and the sound generating unit 30 are summarized below.

Prior to the playing of music, the stop-switch on the panel A 21 of the automatic playing apparatus 20 is turned on. In response thereto, a predetermined quantity of musical playing data (which quantity corresponds to such a predetermined value AD(Max) that defines the maximum permissible quantity of information included in the preread musical playing data, or corresponds to such a predetermined value TM(Max) that defines a maximum permissible length of leading time in the prereading of said data) are preread from the playing data area. The thus preread musical playing data are then output to the sound generating unit 30 as MIDI data and stored in the memory FIFO(1) of said unit.

Subsequently, the start-switch on the panel-A 21 of the automatic playing apparatus 20 is turned on to give the start-data as the MIDI data to the sound generating unit 30. After the sound generating unit 30 has received the start-data, it starts to read the musical playing date which have been preread and stored in the FIFO(1) so as to conduct music playing based on the input of the timing-clock data. On the other hand, the automatic playing apparatus 20 shall preread the musical playing data from the musical playing data area and transfer these data to said unit 30 according to the progress of playing of the music by the unit 30.

It will now be apparent that any stagger or incorrectness which would otherwise be caused by transmissions of the musical playing data is not brought about herein in the timing of the playing since the timing is controlled not depending upon the input of said musical playing data but upon the input of said timing clock data.

When the stop-switch on the panel-A 21 is turned on again, the prereading of musical playing data is stopped and the stop-data is output as the MIDI data and another predetermined amount of musical playing data are preread and output in the automatic playing apparatus 20 in order to make preparation for the next start of the playing.

The sound generating unit 30 which has received the stop-data at the same time shall stop playing.

MODIFICATIONS OF THE EMBODIMENT

The abovedescribed embodiment can be modified in various manners as follows.

The musical playing data may not necessarily be transmitted only at the instant when the stop-switch is turned on in the embodiment but at any other instant in advance before said data are used. For example, said data may previously be transmitted at an instant when an appropriate command is given to the system by means of the manually operable members on panel-A 21, or within a period of time from turning-on of the start-switch to the transmitting of the start-data.

The playing of music may be based on modified musical playing data which may be produced by partially changing of or by adding informations to the originally input musical playing data although these original data themselves are used by sound generating unit 30 to generate sounds in the embodiment. This is possible because there is a length of time between the timing of inputting the musical data and the timing of playing music, the length of time enabling interpretation of the original data to make such changes or additions (including addition of musical tone-controlling data, for instance a tone quality-controlling data) as referred to above. In such a case the sounds can be generated to have higher musical effects by varying the leading shapes or other acoustic characteristics of waveforms, or by controlling the timings of generating sounds on the basis of said leading characteristics or the velocities VEL.

In the aforedescribed embodiment, each data which is transmitted from the musical playing apparatus 20 to the sound generating unit 30 has a form which comprises such step time STET and gate time GATT that are added, as the information of time, to a data component indicating "note-on-event". This form of data makes it possible to directly determine the length of sounds which are to be generated whereby processing for interpretation of the musical playing data can easily be conducted. However, there may be employed another form of data which comprises data components indicating "note-on-event" and "note-off-event", respectively, in addition to the step time STET as the only one information of time. The length of sounds may be calculated in such a case. Furthermore, the step time STET may indicate time lapse from note-on of the present musical note to note-on of the next musical note, instead of indicating the time lapse from the note-on of immediately previous musical note to that of the present musical note as in the embodiment.

Although the quantity of information and the length of time are utilized as the conditions of the prereading of musical playing data, any one of these conditions may solely be used if it is deemed sufficient. It is also possible that some levels of processing rates or speeds of the prereading are incorporated in relation to the conditions of said quantity of information and said length of time in such a manner that the processing is conducted for every decision in the most expedited execution, for every three decisions in a considerably expedited execution and for every ten decisions in an almost unexpedited execution. Accordingly, the execution of prereading scarcely affects the execution of processings other than the pre-reading, and uneven information density per unit time of MIDI data is leveled or reduced. This equalizes the frequency per unit time of MIDI data processing in the sound generating unit 30 which receives said data, thereby reducing influences upon the other processings.

Although there is not employed in the embodiment a processing of a kind called "MIDI soft-through processing" or another kind called "outputting of MIDI data in note-on/off event", it is of course possible to employ any or both of such processings wherein, according to the former processing, the MIDI data fed to the automatic playing apparatus 20 from other electric musical instruments are directly transferred as such to the sound generating unit 30 via microcomputer-A, and according to the latter processing, the note- on/off MIDI data are output without any information of time added thereto in the same manner as they are in the ordinary automatic playing apparatuses. In such a case said processings are executed more preferentially than the prereading of musical playing data, because the outputting of MIDI data in said prereading is permitted to be late a little.

Channel voice messages such as after-touch data and control-change data may be used to transfer the musical playing data, in place of the exclusive messages which are used in the embodiment to transfer said musical data having the time information attached thereto. In such a case, the meanings of the channel voice messages shall be given to and defined in the sound generating unit 30 before playing. It is possible to define said meanings not only by means of manual members operable for the setting of said unit 30 but also by means of such signals that are given to said unit 30 from the automatic playing apparatus 20.

Delivery and receipt of the musical playing data may be done relying on any methods other than the MIDI standards upon which the embodiment relies.

The playing of music may be continued after temporary suspension wherein the process starts again delivering the next and succeeding musical playing data if stop-switch is turned on at the timing of one musical data during the playing, though such a continue-processing is not provided in the embodiment. Alternatively, it also is possible to conduct with ease the continue-processing in such a manner as to restart from an appointed musical playing data.

In the event that in a case where a musical playing data is changed to a new one during the playing the said musical data has already been sent to the sound generating unit 30, nevertheless, the new musical playing data may be given to said unit 30.

If the automatic playing apparatus 20 and the sound generating unit 30 have respective time-measuring means which have the same speed of incremental stepping, then the timing clock data as in the embodiment need not be transmitted. In this case, a processing similar to the timer interrupt processing in the embodiment may be conducted each time when the time-measuring means in the automatic playing apparatus 20 has measured a predetermined length of time. Likewise, a processing similar to the processing which is conducted upon receipt of the timing clock data may be conducted when the time-measuring means in the sound generating unit 30 has measured a predetermined length of time. Adjustment of said time-measuring means in respect of the setting of timings and incremental stepping speeds may be made when the start-switch or stop-switch is turned on.

In the aforedescribed embodiment, the musical playing apparatus 20 is connected directly with the sound generating unit 30, and the musical playing data having attached thereto the time information are supplied to said unit 30 so that they are converted into the data of usual note-on/off type used to generate sounds in said unit 30. However, an appropriate converting device for such conversion of data may be interposed between said apparatus 20 and said unit 30 whereby an ordinary sound generating unit may be adopted in the system instead of the special sound generating unit 30 in the embodiment because such special processings as therein becomes unnecessary by virtue of the interposed converting device.

In a case where there is employed only one sound generating unit 30, ordinary musical playing data are transmitted between said unit 30 and said converting device so that prevention of any discrepancy in the timing of sound-generating is not executed. In another case where the musical playing data are transmmitted from a single automatic playing apparatus 20 to plural sound generating units 30 via respective converting devices, it may however become possible to reduce said discrepancy since transmission of the data between the apparatus 20 and the converting devices will not affect the timing of sound-generating by said unit 30.

Further, because in the aforedescribed embodiment the automatic playing apparatus 20 calculate and determine the advance of reading of temporarily stored musical playing data within said unit 30, one-way type communication means is sufficient in such a system. It is however feasible to employ another communicating device such as those suitable for hand-shake processing and flow-control processing which are useful in providing the said apparatus 20 with information relating such musical playing data that are being used by said unit 30 to generate sounds.

We claim:

1. An automatic playing apparatus for a musical data-prereading playing system, the apparatus comprising:

(a) a first memory means for storing musical playing data representative of music to be played in a time sequence arrangement;

(b) output means;

(c) calculating means for calculating an actual quantity of playing information included in preread musical playing data;

(d) comparing means for determining whether or not the actual quantity of playing information is less than a predetermined quantity of information; and (e) a first reading means for sequentially prereading musical playing data from the first memory means prior to when the music is to be played, and for applying preread musical playing data to the output means only when the comparing means determines that the actual quantity of playing information is less than the predetermined quantity of information, the quantity of playing information included in the musical playing data increasing as the first reading means prereads musical data, and decreasing as music represented by the preread musical playing data is played.

2. An automatic playing apparatus for a musical data-prereading playing system as set forth in claim 1 wherein stored musical playing data comprises a playing-information portion indicative of sound-generating or muting as well as a time-information portion indicative of timing for sound-generating or muting.

3. An automatic playing apparatus for a musical data-prereading playing system as set forth in claim 1 wherein the calculating means determines the actual quantity of playing information before actual playing of the music.

4. An automatic playing apparatus for a musical data-prereading playing system as set forth in claim 1 wherein the calculating means determines the actual quantity of playing information based upon memory capacity required to store preread musical playing data.

5. An automatic playing apparatus for a musical data-prereading playing system as set forth in claim 1 wherein the musical playing data comprises a playing-information portion indicative of sound-generating or muting as well as a time-information portion indicative of timing for sound-generating or muting, and wherein the calculating means determines the actual quantity of playing information based upon memory capacity required for storing preread musical playing data, and all musical playing data representing music which actually has been played.

6. A automatic playing apparatus for a musical data-prereading playing system as set forth in claim 5 wherein the calculating means reads musical playing data stored in the first memory means at a rate at which music is played in order to determine the memory capacity required for all musical playing data representative of music which actually has been played.

7. An automatic playing apparatus for a musical data-prereading playing system as set forth in claim 1, 2, 3, 4, 5, or 6 wherein the output means outputs timing-clock data along with musical playing data.

8. A musical data-prereading playing system comprising an automatic playing apparatus and a sound generating unit, the automatic playing apparatus comprising (a) a first memory means for storing musical playing data representative of music to be played in a time sequence arrangement;

(b) output means;

(c) calculating means for calculating an actual quantity of playing information included in preread musical playing data;

(d) comparing means for determining whether or not the actual quantity of playing information is less than a predetermined quantity of information; and (e) a first reading means for sequentially prereading musical playing data from the first memory means prior to when the music is to be played, and for applying preread musical data to the output means only when the comparing means determines that the actual quantity of playing information is less than the predetermined quantity of information, the quantity of playing information included in the musical playing data increasing as the first reading means prereads musical data, and decreasing as music represented by the preread musical playing data is played, and the sound generating unit comprising (f) input means for receiving from the output means, musical playing data which are arranged in a time sequence and which have been preread;

(g) a second memory means for temporarily storing preread musical playing data supplied by the input means;

(h) a second reading means for sequentially reading from the second memory means preread musical playing data written therein according to a time sequence, in accordance with a predetermined timing; and (i) musical tone-generating means for generating and/or muting musical tones for playing music represented by musical playing data read by the second reading means.

9. A musical data-prereading playing system as set forth in claim 8 wherein the output means applies timing-clock data in addition to the musical playing data to the input means of the sound generating unit, the second reading means relying upon the timing-clock data as the predetermined timing.

10. A musical data-prereading playing system as set forth in claim 8 wherein stored musical playing data comprises a playing-information portion indicative of sound-generating or muting as well as a time-information portion indicative of timing for sound-generating or muting.

11. A musical data-prereading playing system as set forth in claim 8 wherein the calculating means determines the actual quantity of playing information before actual playing of the music.

12. A musical data-prereading playing system as set forth in claim 8 wherein the calculating means determines the actual quantity of playing information based upon memory capacity required to store preread musical playing data.

13. A musical data-prereading playing system as set forth in claim 8 wherein stored musical playing data comprises a playing-information portion indicative of sound-generating or muting as well as a time-information portion indicative of timing for sound-generating or muting, and wherein the calculating means determines the actual quantity of playing information based upon memory capacity required for storing all preread musical playing data and all musical playing data representing music which actually has been played.

14. A musical data-prereading playing system as set forth in claim 13 wherein the calculating means reads musical playing data stored in the first memory means at a rate at which music is played in order to determine the memory capacity required for all musical playing data representative of music which actually has been played.

15. A musical data-prereading playing system as set forth in claim 10, 11, 12, 13 or 14 wherein the second reading means includes a time-measuring means so that an actually measured length of time is used to give the predetermined timing.

* * * * *